United States Patent
Lin et al.

(10) Patent No.: US 6,797,988 B2
(45) Date of Patent: Sep. 28, 2004

(54) LIGHT-EMITTING DIODE WITH ENHANCED LIGHT-EMITTING EFFICIENCY

(75) Inventors: Ming-Der Lin, Hsinchu (TW); Jung-Kuei Hsu, Taipei (TW); San-Bao Lin, Jungli (TW); Ching-Shih Ma, Taoyuan (TW)

(73) Assignee: Opto Tech Corporation, Hsinchu (TW)

( * ) Notice: Subject to any disclaimer, the term of this patent is extended or adjusted under 35 U.S.C. 154(b) by 0 days.

(21) Appl. No.: 10/421,743

(22) Filed: Apr. 24, 2003

(65) Prior Publication Data

US 2003/0222269 A1 Dec. 4, 2003

(30) Foreign Application Priority Data

Jun. 3, 2002 (TW) ........................................ 91111802 A

(51) Int. Cl.⁷ ............................................ H01L 29/227

(52) U.S. Cl. ........................................... 257/98; 257/99

(58) Field of Search ............................. 257/79, 94, 96, 257/97, 98, 99, 88

(56) References Cited

U.S. PATENT DOCUMENTS 6,630,366 B2 * 10/2003 Taniguchi et al. ............ 438/34

* cited by examiner

*Primary Examiner*—Sara Crane
(74) *Attorney, Agent, or Firm*—Rosenberg, Klein & Lee

(57) ABSTRACT

The present invention discloses a light-emitting diode with enhanced light-emitting efficiency, in which the active current is prevented from flowing in the region under the top electrode so that the light-emitting efficiency as well as the brightness can be improved. The light-emitting diode comprises: a substrate; a first electrode formed on the bottom surface of the substrate; an epitaxial LED structure having a pn junction formed on the top surface of the substrate, and a groove formed on the epitaxial LED structure passing through the pn junction such that the epitaxial LED structure is divided into a first epitaxial LED region and a second epitaxial LED region, and the groove having a side light-reflective layer and an insulating layer; a bottom insulating layer formed on the top surface of the first epitaxial LED region; a second electrode formed on the top surface of the bottom insulating layer; and a plurality of extending conductive contacts formed on the top surface of the second epitaxial LED region, each extending conductive contact connected to the second epitaxial LED region through an extending conductive wire.

23 Claims, 4 Drawing Sheets

LIGHT-EMITTING DIODE WITH ENHANCED LIGHT-EMITTING EFFICIENCY

BACKGROUND OF THE INVENTION

1. Field of the Invention

The present invention generally relates to a light-emitting diode and, more particularly, to a light-emitting diode with enhanced light-emitting efficiency, in which the active current is blocked to prevent from entering the region under the top electrode so that the light-emitting efficiency as well as the brightness can be improved.

2. Description of the Prior Art

The light-emitting diode (to be abbreviated as LED hereinafter) has received considerable attention for its advantages such as long lifetime, small size, low heat generation, low power consumption, high response speed, monochromic lighting ability, etc. and has been widely used in applications such as computer peripherals, clock displays, display panels, and many other 3C (computer, communication and consumer) products since the 1960s. Therefore, the LED has become one of the most important light sources.

To further improve the brightness as well as the light-emitting efficiency of an LED, there have been disclosed lots of new techniques such as U.S. Pat. No. 5,153,889 entitled "Semiconductor light-emitting device" filed by Kabushiki Kaisha (Toshiba, JP), U.S. Pat. No. 6,319,778 entitled "Method of making light-emitting diode" filed by Tzer-Perng Chen et al. (United Epitaxy Company, Inc., TW), Taiwan Patent No. 232753 entitled "Method for manufacturing light-emitting diode with enhanced brightness" filed by ITRI (TW) and Taiwan Patent No. 264573 entitled "Light-emitting diode with current blocking layer" filed by Tzer-Perng Chen (TW). These disclosures have significantly improved the LED structure.

FIG. 1 is a cross-sectional view showing a structure of a light-emitting diode according to U.S. Pat. No. 5,153,889. The light-emitting device comprises: a first electrode 17; a substrate 11; an epitaxial LED layer 13 composed of at least a top limiting layer, a light-emitting active layer and a bottom limiting layer to form a p-n junction; a transparent window layer 15; a second electrode 19; and a current blocking layer 14; wherein the current blocking layer 14 is used to reduce the density of the active current flowing through the bottom region of the second electrode 19, so as to relatively increase the density of the active current flowing through the epitaxial LED layer 13 uncovered by the second electrode 19, thereby improving the light-emitting efficiency, as indicated by the arrow d showing the emitted light.

However, for the formation of the current blocking layer 14, the transparent window layer 15 becomes indispensable, which may add complexity to the manufacturing procedure. Moreover, a considerable amount of active current still flows through the second electrode 19 and the bottom region of the current blocking layer 14, as indicated by the dotted line a showing the current path. The light thus generated at the p-n junction emits upward and is absorbed by the current blocking layer 14, as indicated by the arrow b. Therefore, the light-emitting efficiency of the LED is reduced. In addition to the upward emitted light d, slanted light beams such as c1, c2, are also generated at the p-n junction. However, some of the light beams c1, c2 are also blocked and absorbed either by the current blocking layer 14 or the second electrode 19. This also reduces the light-emitting efficiency of the LED.

Therefore, there is need in providing a light-emitting diode with enhanced light-emitting efficiency, even without a transparent window, so as to prevent the active current from entering the bottom region of the second electrode and thus improve the light-emitting efficiency and the brightness.

SUMMARY OF THE INVENTION

Accordingly, it is the primary object of the present invention to provide a light-emitting diode with enhanced light-emitting efficiency, in which a ring-shaped groove is formed to divide an epitaxial LED structure into a first epitaxial LED region and a second epitaxial LED region, and an insulating layer is formed in the groove and on the top surface of the first epitaxial LED region, such that the active current is surely prevented from flowing through the first epitaxial LED region under the bottom layer of the second electrode, thereby enhancing the light-emitting efficiency of the LED.

It is another object of the present invention to provide a light-emitting diode with enhanced light-emitting efficiency, in which a light-reflective layer is formed in the groove and on the top surface of the first epitaxial LED region, thereby enhancing the brightness of the LED.

It is still another object of the present invention to provide a light-emitting diode with enhanced light-emitting efficiency, in which a transparent window layer is omitted according to practical use, thereby reducing the volume of the LED.

In order to achieve the foregoing objects, the present invention provides a light-emitting diode with enhanced light-emitting efficiency, comprising: a substrate; a first electrode formed on the bottom surface of said substrate; an epitaxial LED structure having a pn junction formed on the top surface of said substrate, wherein a groove is formed on said epitaxial LED structure to pass through said pn junction such that said epitaxial LED structure is divided into a first epitaxial LED region and a second epitaxial LED region, and in said groove are formed a side light-reflective layer and an insulating layer; a bottom insulating layer formed on the top surface of said first epitaxial LED region; a second electrode formed on the top surface of said bottom insulating layer; and a plurality of extending conductive contacts formed on the top surface of said second epitaxial LED region, each of said extending conductive contacts connected to said second epitaxial LED region through an extending conductive wire.

Other and further features, advantages and benefits of the invention will become apparent in the following description taken in conjunction with the following drawings. It is to be understood that the foregoing general description and following detailed description are exemplary and explanatory but are not to be restrictive of the invention. The accompanying drawings are incorporated in and constitute a part of this application and, together with the description, serve to explain the principles of the invention in general terms. Like numerals refer to like parts throughout the disclosure.

BRIEF DESCRIPTION OF THE DRAWINGS

The objects, spirits and advantages of the preferred embodiments of the present invention will be readily understood by the accompanying drawings and detailed descriptions, wherein.

DETAILED DESCRIPTION OF THE INVENTION

The present invention providing a light-emitting diode with enhanced light-emitting efficiency can be exemplified by the preferred embodiments as described hereinafter.

Figure 1:
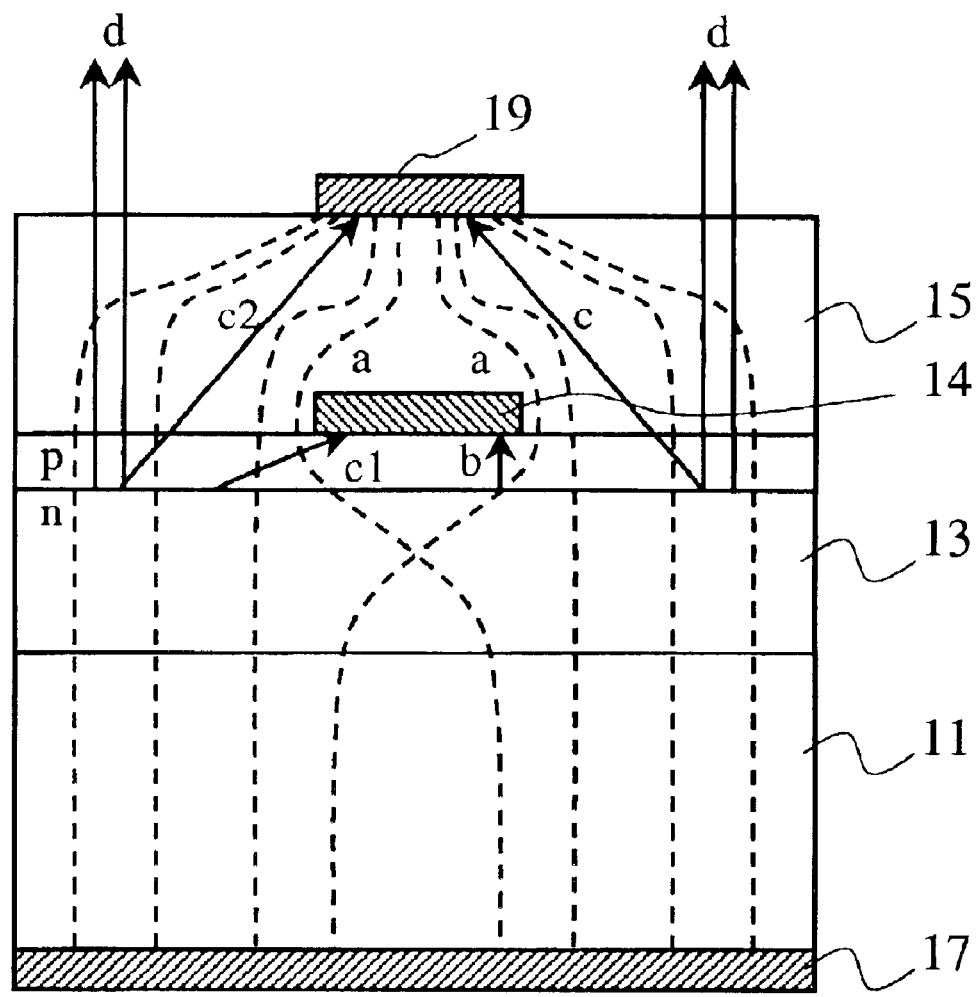
FIG. 1 is a cross-sectional view showing a light-emitting diode in accordance with the prior art.
Figure 2:
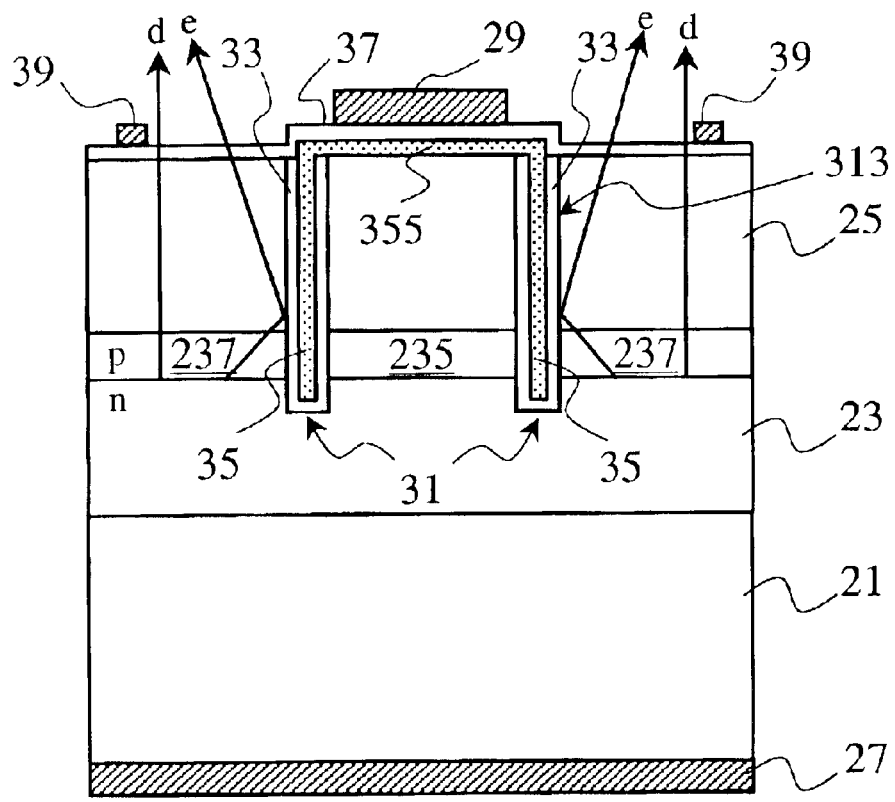
FIG. 2 is a cross-sectional view showing a light-emitting diode in accordance with a first preferred embodiment of the present invention.
Figure 3:
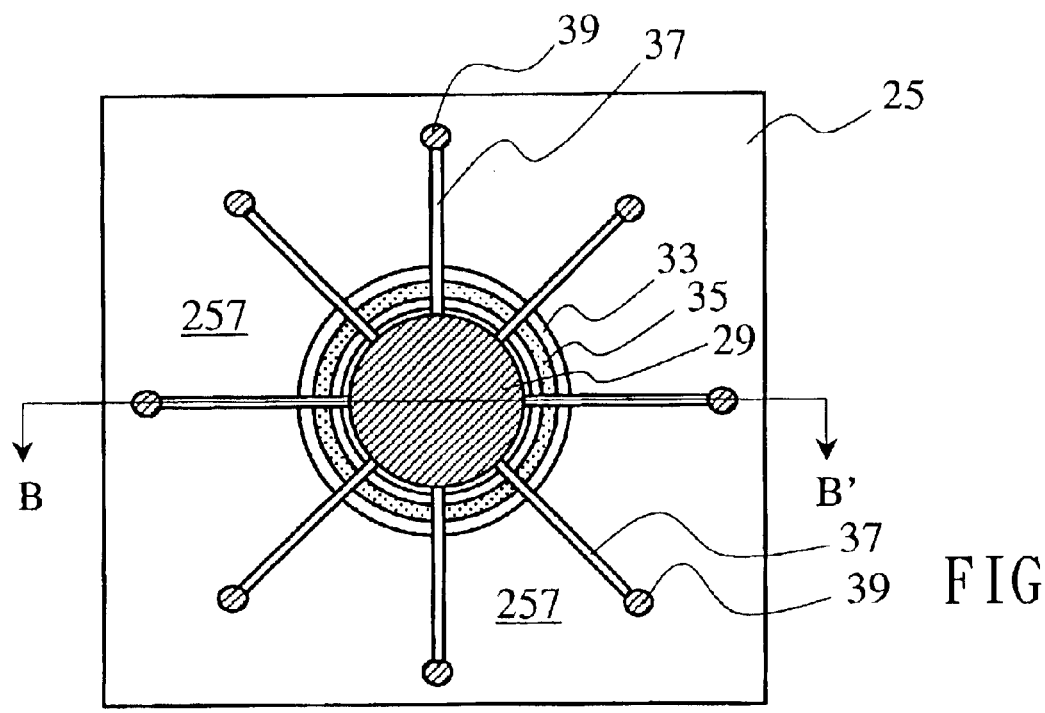
FIG. 3 is a top view showing the light-emitting diode of FIG. 2.

Please refer to FIG. 2 and FIG. 3, which show, respectively, a cross-sectional view and a top view of a light-emitting diode in accordance with a first preferred embodiment of the present invention. As shown in the figures, the light-emitting diode according to the present invention comprises: a substrate 21; a first electrode 27 formed on the bottom surface of the substrate 21; an epitaxial LED structure 23 having a pn junction formed on the top surface of the substrate 21; and a transparent window layer 25 formed on the top surface of the epitaxial LED structure 23. A channel 313 is chiseled in a proper portion, for example the center portion according to the present embodiment, on the transparent window layer 25. The channel 313 had penetrated through the transparent window layer 25 reaching the pn junction to form a groove 31 so as to result in dividing the epitaxial LED structure 23 into two regions: a first epitaxial LED region 235 and a second epitaxial LED region 237. An insulating layer (side insulating layer) 35 is formed in the groove 31 and a bottom insulating layer 355 is formed on the top surface of the first epitaxial LED region 235 so as to connect the side insulating layer 35. A second electrode 29 for connecting the active current is formed along the longitudinal extended direct of the bottom insulating layer 355. Therefore, with the encircled isolation provided by the side insulating layer 35 and the bottom insulating layer 355, the active current is surely prevented from flowing through the pn junction of the first epitaxial LED region 235 under the bottom layer of the second electrode 29.

As a predetermined light-emitting area, the second epitaxial LED region 237 includes a transparent window layer 25, which are formed a plurality of extending conductive contacts 39. Each of the extending conductive contacts 39 is connected to the second electrode 29 through an extending conductive wire 37 such that an active current network is built by connecting the second electrode 29 and the first electrode 27 through the uniformly distributed extending conductive contacts 39 on the transparent window layer 25 around the second electrode 29. Accordingly, the active current flows entirely through the pn junction in the second epitaxial LED region 237 of the predetermined lighting-area so as to emit the upward emitted light, as indicated by the arrow d in FIG. 2. Therefore, in order to prevent the active current from flowing through the bottom region of the second electrode 29 to result in that light-emitting source is covered, the enhanced light-emitting efficiency is obtained.

Moreover, in order to efficiently incorporate the slanted light beams indicated by the arrow e emitted from the pn junction of the second epitaxial LED region 237, a light-reflective layer 33 is formed between the outer surface of the side insulating layer 35 and the groove 31 such that the slanted light beams towards the second electrode 29 can be reflected by the light-reflective layer 33 to emit towards the light-emitting region so as to improve the brightness of the LED.

The extending conductive wires 37 occupy a very few amount of area of the light-emitting region. Therefore, the extending conductive wires 37 are not necessarily formed of transparent materials. Certainly, the brightness of an LED will be improved if transparent materials are used for the extending conductive wires 37. Moreover, in order to simplify the fabrication process, a transparent conductive film formed of one of indium tin oxide (ITC), indium oxide, tin oxide, zinc oxide, magnesium oxide, titanium oxide, nickel oxide, cobalt oxide, aluminum nitride, indium nitride, titanium nitride, tantalum nitride and combination thereof is formed covering the bottom insulating layer 355 and the transparent window 25 on the second epitaxial LED region 237 after the bottom insulating layer 355 is formed, such that the transparent conductive film is used as extending conductive wires. Moreover, the second electrode 29 or the extending conductive contacts 39 can be formed either on the surface of the transparent conductive film or on the surface of the bottom insulating layer and the transparent window layer 25. In this case, the extending conductive contacts 39 can be replaced by the transparent conductive film.

In the present embodiment, the groove 31 is formed in a ring shape so as to prevent the active current from flowing into the pn junction in the first epitaxial LED region 235. However, the present invention is not limited thereto and the groove 31 can be formed in various shapes according to practical use.

Figure 4:
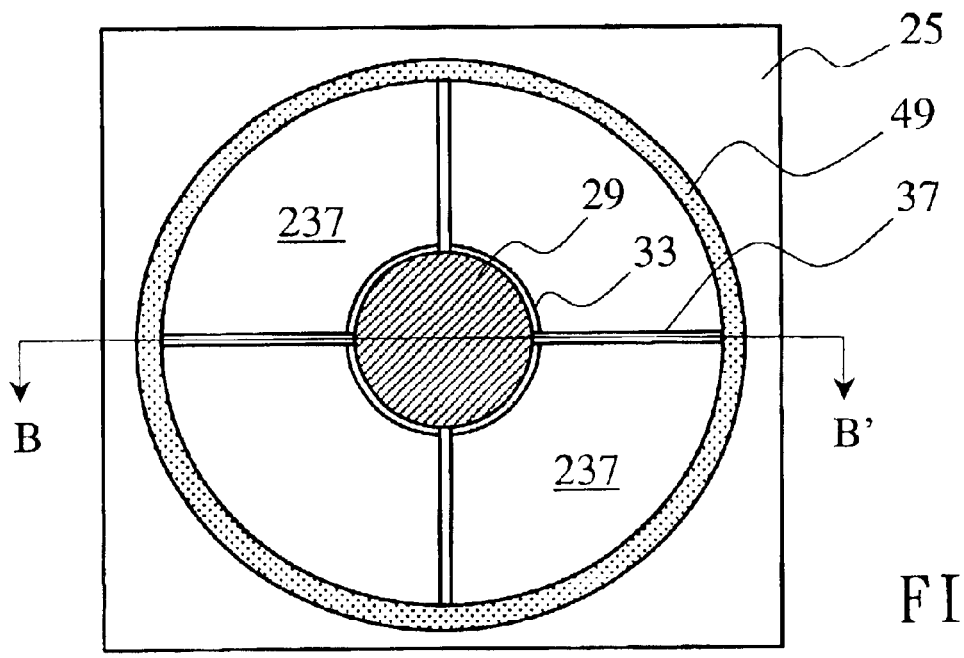
FIG. 4 is a top view showing a light-emitting diode in accordance with a second preferred embodiment of the present invention.

Furthermore, please refer to FIG. 4, which is a top view showing a light-emitting diode in accordance with a second preferred embodiment of the present invention. In the present embodiment, an extending contact ring 49 is formed by connecting the plurality of extending conductive contacts 39 such that the number of required extending conductive wires 37, thereby reducing the area blocking the emitted light and improving the light-emitting efficiency. In the present embodiment, transparent materials such as ITO can be used as the extending conductive contacts 39 or the extending contact ring 49.

Figure 5:
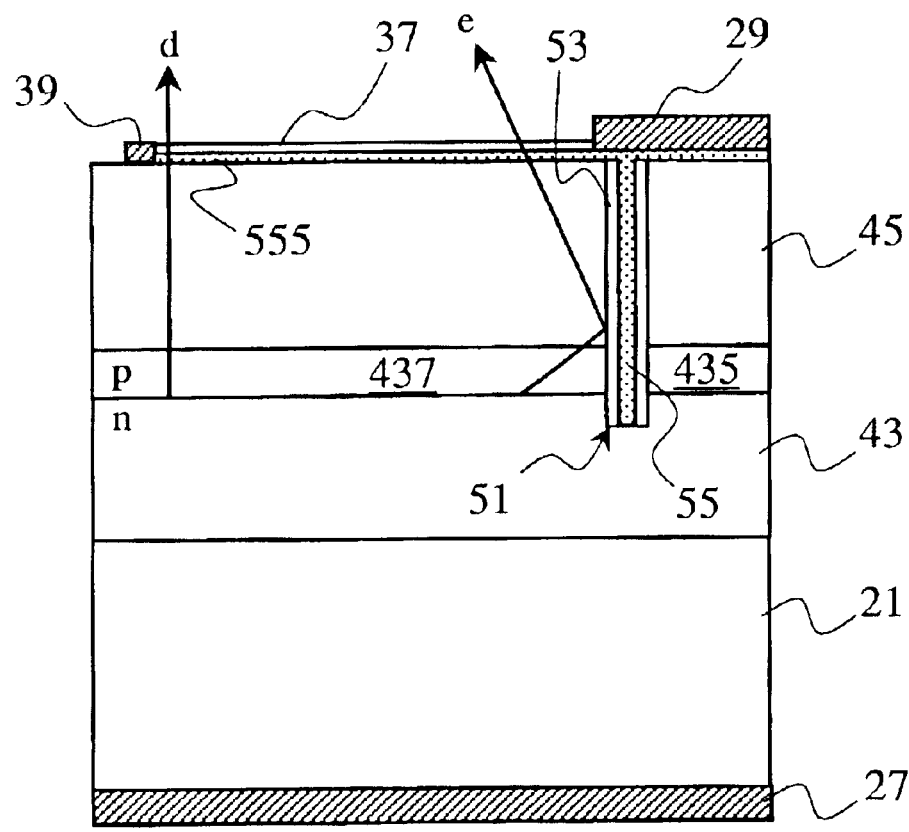
FIG. 5 is a cross-sectional view showing a light-emitting diode in accordance with a third embodiment of the present invention.

Please also refer to FIG. 5, which is a cross-sectional view showing a light-emitting diode in accordance with a third embodiment of the present invention. In the present embodiment, a groove 51 is formed on a side portion of the epitaxial LED structure 43 and the transparent window layer 45. Similar to the previous embodiments, the epitaxial LED structure 43 is divided into two regions: a first epitaxial LED region 435 and a second epitaxial LED region 437. In the groove 51 are formed a side insulating layer 55 and a light-reflective layer 53. An extending insulating layer 555 is formed along with the extending conductive wires 37 on the surface of the bottom surface of the second electrode 29 and the top surface of the transparent window layer 45. The extending conductive wires 37 is formed between the second electrode 29 and the extending conductive contacts 39. In this manner, a light-emitting diode with enhanced light-emitting efficiency as well as improved brightness is formed.

Moreover, in order to reduce the volume percentage occupied by the first epitaxial LED region 435 that contributes nothing to the emitted light, the groove 51 can be chiseled in the bottom longitudinal extended region of the second electrode 29.

Figure 6:
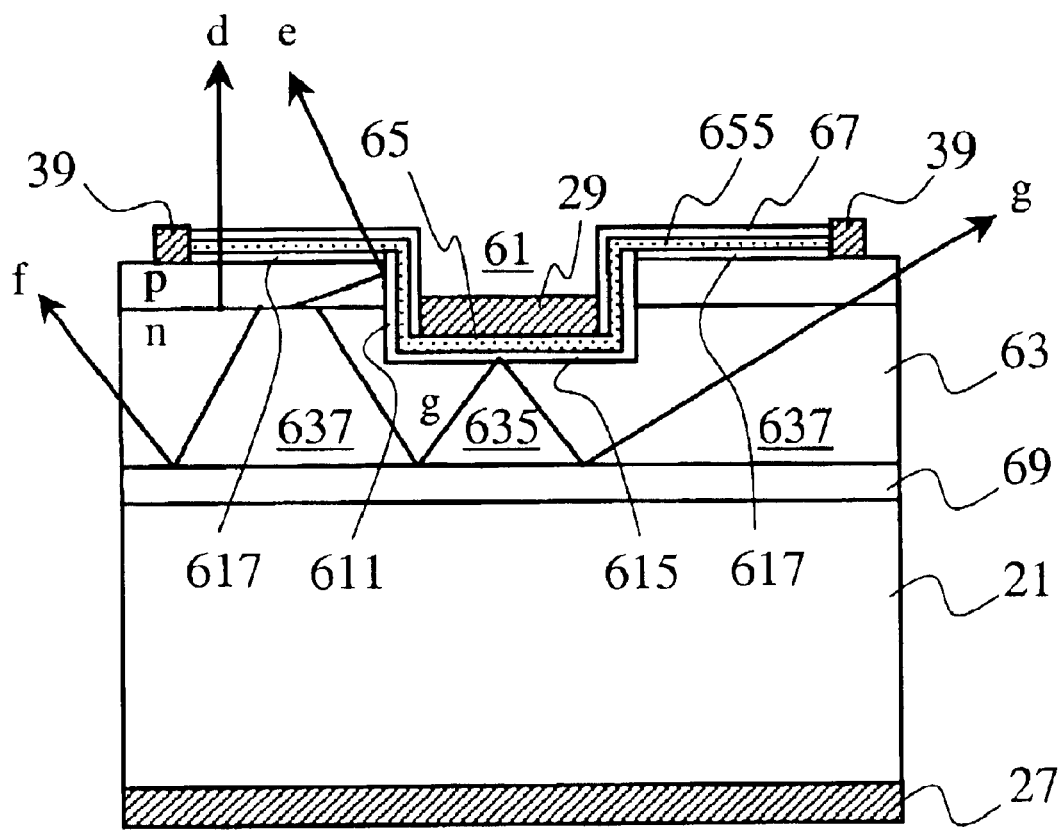
FIG. 6 is a cross-sectional view showing a light-emitting diode in accordance with a fourth embodiment of the present invention.

At last, please refer to FIG. 6, which is a cross-sectional view showing a light-emitting diode in accordance with a fourth embodiment of the present invention. As shown in the figure, the groove 51 is designed for segmenting the pn junction. Therefore, the transparent window layer 45 in the previous embodiments is selectively omitted to regard as the demand of practical design. And the groove 51 is also to be a central trench 61 formed directly in the pn junction. Similar to the previous embodiments, the epitaxial LED structure 63 is divided into two regions: a first epitaxial LED region 635 and a second epitaxial LED region 637. In the central trench 61 are formed a side light-reflective layer 611 and a bottom light-reflective layer 615. An extending light-reflective layer 617 is used for light reflective function formed along with a plurality of extending conductive wires 67 on the top surface of the second epitaxial LED region 637. A bottom insulating layer 65 and extending insulating layer 655 are respectively formed on the surface of the bottom light-reflective layer 615, the side light-reflective layer 611 and the extending light-reflective layer 617. Thereafter, a second electrode 29 is formed on the bottom insulating layer 65, and the second electrode 29 is electrically connected to the extending conductive contacts 39 by the plurality of extending conductive wires 67 and.

Furthermore, in order to improve the brightness of the LED, a conductive light-reflective layer 69 is further formed on the bottom edge of the epitaxial LED structure 63, or the top/bottom surface of the first electrode 27 such as to form a distributed Bragg reflector (DBR) so as to the slanted light beams as indicated by the arrows e, f or g are reflected by the DBR 69, the bottom light-reflective layer 615, the side light-reflective layer 611 or the extending light-reflective layer 617 into the effective light-emitting region. In this case, the light-emitting efficiency as well as the brightness of the LED is enhanced.

An extending contact 39 is formed between the second electrode 29 and the first electrode 27. In this manner, a light-emitting diode with enhanced light-emitting efficiency as well as improved brightness is formed.

According to the above discussion, it is apparent that the present invention discloses a light-emitting diode with enhanced light-emitting efficiency, in which the active current is prevented from flowing into the region vertically under the top electrode so that the light-emitting efficiency as well as the brightness of the LED can be improved. Therefore, the present invention has been examined to be progressive, advantageous and applicable to the industry.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. A light-emitting diode (LED) with enhanced light-emitting efficiency, comprising:
    a substrate;
    a first electrode formed on the bottom surface of said substrate;
    an epitaxial LED structure having a P-N junction formed on the top surface of said substrate, wherein at least one groove is appropriately formed on said epitaxial LED structure to penetrate said P-N junction such that said epitaxial LED structure is distinguished into a first epitaxial LED region and a second epitaxial LED region, and a side reflective layer and an insulating layer are formed on said groove;
    a bottom insulating layer formed on the top surface of said first epitaxial LED region;
    a second electrode formed on the top surface of said bottom insulating layer; and
    a plurality of extending conductive contacts formed on the top surface of said second epitaxial LED region, each of said extending conductive contacts connected to said second epitaxial LED region through an extending conductive wire.

2. The light-emitting diode as recited in claim 1, wherein said extending conductive wire is formed of a transparent conductive film.

3. The light-emitting diode as recited in claim 1, wherein an extending insulating layer is formed on the bottom surface of said extending conductive wire.

4. The light-emitting diode as recited in claim 1, wherein an extending reflective layer is formed on the bottom surface of said extending conductive wire.

5. The light-emitting diode as recited in claim 1, wherein a bottom reflective layer is formed on the top surface of said first epitaxial LED region.

6. The light-emitting diode as recited in claim 1, wherein a distributed Bragg reflector (DBR) layer is formed on the bottom surface of said epitaxial LED structure.

7. The light-emitting diode as recited in claim 1, wherein said plurality of extending conductive contacts are formed to an extending contact ring-shaped.

8. The light-emitting diode as recited in claim 1, wherein said first epitaxial LED region is disposed on a central portion of said epitaxial LED structure and said groove is ring-shaped for isolating said first epitaxial LED region.

9. The light-emitting diode as recited in claim 1, wherein said first epitaxial LED region is disposed on a side portion of said epitaxial LED structure for being isolated from said second epitaxial LED region by said groove.

10. The light-emitting diode as recited in claim 2, wherein said transparent conductive film is formed of one of indium tin oxide (ITC), indium oxide, tin oxide, zinc oxide, magnesium oxide, titanium oxide, nickel oxide, cobalt oxide, aluminum nitride, indium nitride, titanium nitride, tantalum nitride and combination thereof.

11. The light-emitting diode as recited in claim 1, wherein a transparent window layer is formed on the top surface of said epitaxial LED structure and a via on said transparent window layer is formed corresponding to the vertical extending position of said groove on said epitaxial LED structure such that said via and said groove are formed as one.

12. The light-emitting diode as recited in claim 1, wherein said groove is formed on the vertical extending position of said second electrode.

13. A light-emitting diode (LED) with enhanced light-emitting efficiency, comprising:
    a substrate;
    a first electrode formed on the bottom surface of said substrate;
    an epitaxial LED structure having a P-N junction formed on the top surface of said substrate, wherein at least one groove is appropriately formed on said epitaxial LED structure to penetrate said P-N junction such that said epitaxial LED structure is distinguished into a first epitaxial LED region and a second epitaxial LED region, and a reflective layer is formed on said groove;

a bottom insulating layer formed on the top surface of said first epitaxial LED region;

a second electrode formed on the top surface of said bottom insulating layer; and at least one transparent conductive film formed on the top surface of said second epitaxial LED region.

14. The light-emitting diode as recited in claim 13, wherein said at least one transparent conductive film is at least one extending conductive contact distributed on the top surface of said second epitaxial LED region, each said extending conductive contact electrically connected to said second electrode through an extending conductive wire and an extending insulating layer formed on the bottom surface of said extending conductive wire such that said extending conductive wire is isolated from said second epitaxial LED region.

15. The light-emitting diode as recited in claim 13, wherein a bottom reflective layer is formed on the top surface of said first epitaxial LED region.

16. The light-emitting diode as recited in claim 13, wherein said first epitaxial LED region is formed on one of a central portion and a side portion of said epitaxial LED structure.

17. The light-emitting diode as recited in claim 13, wherein a transparent window layer is formed on the top surface of said epitaxial LED structure and a via on said transparent window layer is formed corresponding to the vertival extending position of said groove on said epitaxial LED structure such that said via and said groove are formed as one.

18. The light-emitting diode as recited in claim 13, wherein said groove is formed on the vertical extending position of said second electrode.

19. The light-emitting diode as recited in claim 13, wherein a distributed Bragg reflector (DBR) layer is formed on the bottom surface of said epitaxial LED structure.

20. A light-emitting diode (LED) with enhanced light-emitting efficiency, comprising:

a substrate;

a first electrode formed on the bottom surface of said substrate;

an epitaxial LED structure having a P-N junction formed on the top surface of said substrate, wherein a central trench is formed on a central portion of said epitaxial LED structure to penetrate said P-N junction such that said epitaxial LED structure is distinguished into a first epitaxial LED region and a second epitaxial LED region, and a reflective layer and a bottom insulating layer are formed on said central trench;

a second electrode formed on the top surface of said bottom insulating layer; and at least one transparent conductive film formed on the top surface of said second epitaxial LED region.

21. The light-emitting diode as recited in claim 20, wherein said at least one transparent conductive film is at least one extending conductive contact distributed on the top surface of said second epitaxial LED region, each said extending conductive contact electrically connected to said second electrode through an extending conductive wire and an extending insulating layer formed on the bottom surface of said extending conductive wire such that said extending conductive wire is isolated from said second epitaxial LED region.

22. The light-emitting diode as recited in claim 20, wherein a transparent window layer is fonned on the top surface of said epitaxial LED structure and a via on said transparent window layer is formed corresponding to the vertical extending position of said central trench on said epitaxial LED structure such that said via and said central trench are formed as one.

23. The light-emitting diode as recited in claim 20, wherein a distributed Bragg reflector (DBR) layer is formed on the bottom surface of said epitaxial LED structure.

* * * * *